United States Patent
Tsukihara et al.

(10) Patent No.: US 7,982,192 B2
(45) Date of Patent: Jul. 19, 2011

(54) BEAM PROCESSING APPARATUS

(75) Inventors: Mitsukuni Tsukihara, Ehime (JP);
Mitsuaki Kabasawa, Ehime (JP);
Hiroshi Matsushita, Ehime (JP);
Takanori Yagita, Ehime (JP); Yoshitaka Amano, Ehime (JP); Yoshito Fujii, Ehime (JP)

(73) Assignee: SEN Corporation, Tokyo (JP)

( * ) Notice: Subject to any disclaimer, the term of this patent is extended or adjusted under 35 U.S.C. 154(b) by 610 days.

(21) Appl. No.: 12/106,735

(22) Filed: Apr. 21, 2008

(65) Prior Publication Data
US 2008/0258074 A1    Oct. 23, 2008

(30) Foreign Application Priority Data
Apr. 20, 2007   (JP) ................. 2007-111528

(51) Int. Cl.
*H01J 37/317*    (2006.01)
(52) U.S. Cl. ............. 250/396 R; 250/492.1; 250/492.2; 250/397; 250/398; 250/492.21
(58) Field of Classification Search ............. 250/396 R, 250/492.3, 492.2, 397, 398, 492.1, 492.21
See application file for complete search history.

(56) References Cited

U.S. PATENT DOCUMENTS

| | | | |
|---|---|---|---|
| 4,254,340 A | | 3/1981 | Camplan et al. |
| 5,691,537 A | | 11/1997 | Chen et al. |
| 6,060,715 A | * | 5/2000 | England et al. ........... 250/492.21 |
| 6,075,249 A | * | 6/2000 | Olson ........................ 250/396 R |
| 6,441,382 B1 | * | 8/2002 | Huang ........................ 250/492.21 |
| 6,639,227 B1 | * | 10/2003 | Glavish et al. ............. 250/492.2 |
| 7,276,711 B2 | * | 10/2007 | Kawaguchi et al. ...... 250/492.21 |
| 2005/0151089 A1 | * | 7/2005 | Bong et al. ................ 250/396 R |
| 2006/0113467 A1 | * | 6/2006 | Yagita et al. ................... 250/290 |
| 2006/0113490 A1 | * | 6/2006 | Matsushita et al. ....... 250/492.21 |
| 2006/0113491 A1 | * | 6/2006 | Kawaguchi et al. ...... 250/492.21 |
| 2007/0108390 A1 | * | 5/2007 | Radovanov et al. ....... 250/396 R |

FOREIGN PATENT DOCUMENTS

| | | |
|---|---|---|
| EP | 1 662 542 A2 | 5/2006 |
| EP | 1 981 059 A2 | 10/2008 |
| JP | 02-005343 A | 1/1990 |
| JP | 2006-156236 A | 6/2006 |

\* cited by examiner

*Primary Examiner* — Robert Kim
*Assistant Examiner* — Michael J Logie
(74) *Attorney, Agent, or Firm* — Arent Fox LLP

(57) ABSTRACT

In a beam processing apparatus including a beam scanner having a two electrodes type deflection scanning electrode, the beam scanner further includes shielding suppression electrode assemblies respectively at vicinities of upstream side and downstream side of the two electrodes type deflection scanning electrode and having openings in a rectangular shape for passing a charged particle beam. Each of the shielding suppression electrode assemblies is an assembly electrode comprising one sheet of a suppression electrode and two sheets of shielding ground electrodes interposing the suppression electrode. A total of front side portions and rear side portions of the two electrodes type deflection scanning electrode is shielded by the two sheets of shielding ground electrodes.

14 Claims, 11 Drawing Sheets

BEAM PROCESSING APPARATUS

This application is based upon and claims the benefit of priority from Japanese patent application No. 2007-111528, filed on Apr. 20, 2007, the disclosure of which is incorporated herein in its entirety by reference.

FIELD OF THE INVENTION

The present invention relates to a beam processing apparatus by an ion beam or a charged particle beam, particularly relates to an electrostatic type beam deflecting apparatus used therefor.

The present invention relates to an ion implantation apparatus of a type of implanting an ion to a substrate after subjecting a large current ion beam, for example, of a low energy through a middle energy to a deflection scanning by an electrostatic electric field and paralleling (parallelizing) by an electrostatic electric field. The present invention particularly relates to an improvement for promoting a scanning accuracy of an ion beam and for restraining a zero electric field effect at inside of an electrostatic type beam deflection scanning apparatus and an improvement for promoting a paralleling accuracy of a beam paralleling apparatus to be able to improve an ion implanting uniformity in a scanning direction.

DESCRIPTION OF THE RELATED ART

An explanation will be made with regard to a constitution and an operation of an electrostatic type beam deflection scanning apparatus (hereinafter, abbreviated as beam scanner) of a related art applied to an ion implantation apparatus in reference to FIG. 1A through FIG. 1D. Further, the drawing is only a schematic view for explaining the operation of the beam scanner and sizes and positional relationships of respective constituent elements, mentioned later, are not rectified by the drawing.

As shown by FIG. 1A, the beam scanner includes a pair of scanning electrodes (two electrodes type deflection scanning electrode) 51A and 51B arranged to be opposed to each other to interpose a region of passing an ion beam. Suppression electrodes 52 and 53 respectively for suppression of electrons are arranged on upstream side (front side) and downstream side (rear side) of the scanning electrodes 51A and 51B in a beam line direction. The suppression electrodes 52 and 53 respectively have openings at the region of passing the ion beam. A shielding ground electrode 54 is arranged contiguous to the suppression electrode 53 of the downstream side.

An ion beam incident on a beam scanner of this kind is constituted by a positive ion of a desired ion species, and an electron attracted to the positive ion is attached around the ion beam.

The beam scanner is connected to an alternating current power source (not shown), and an alternating current voltage from the alternating current power source is applied between the scanning electrodes 51A and 51B. There are following three states in states of applying voltages to the scanning electrodes 51A and 51B of the beam scanner in a gross classification.

1. As shown by FIG. 1B, a negative voltage is applied to the scanning electrode 51A on one side of the beam scanner, and a positive voltage is applied to the scanning electrode 51B on other side, respectively.

2. As shown by FIG. 1C, a positive voltage is applied to the scanning electrode 51A on one side of the beam scanner and a negative voltage is applied to the scanning electrodes 51B on other side, respectively.

3. As shown by FIG. 1D, voltages of both of the scanning electrodes 51A and 51B of the beam scanner are zero. This signifies that positive and negative potentials applied to the scanning electrodes 51A and 51B are being switched.

In FIG. 1B, an ion having a positive charge passing the beam scanner is attracted to the scanning electrode 51A on a left side having a negative voltage. On the other hand, an electron attached around the ion beam is attracted to the scanning electrode 51B on a right side having a positive voltage. The ion beam loses an electron during a time period of passing the beam scanner, ions having positive charges are repelled by each other by a space charge effect, and therefore, the ion beam tends to be diverged. Further, an electron is lighter than an ion in a mass thereof, and therefore, an angle of deflection thereof is larger than that of the ion.

Also in FIG. 1C, an ion beam tends to be diverged during a time period of passing the beam scanner by reason the same as that of FIG. 1B.

On the other hand, in FIG. 1D, voltages of both of the scanning electrodes 51A and 51B of the beam scanner are zero, and therefore, the ion beam advances to pass through between the scanning electrodes 51A and 51B. Also an electron attracted to the ion beam advances to pass therethrough without being attracted to the scanning electrode, and therefore, the ion beam passing through the beam scanner tends to be converged to some degree by a remaining electron. Such a phenomenon may be referred to as a zero electric field effect. The zero electric field effect has been restrained by a pair of upper and lower zero electric field correcting electrodes, mentioned later. A beam scanner of this kind is disclosed in, for example, Patent Reference 1 (JP-A-2006-156236).

Further, according to an ion implantation apparatus of a related art, a sectional shape of an ion beam incident on a beam scanner has been changed by high or low of a beam energy of the ion beam, a difference of the ion species (for example, P, B, As or the like), large or small of a beam size, large or small of the beam current density, and by a difference in a slit size of a mass analysis slit. Therefore, in order to irradiate an ion beam to a wafer in a uniform state, particularly, it is requested to promote a function of a beam scanner constituting a main point.

SUMMARY OF THE INVENTION

As described above, when the ion beam is scanned with electrostatic deflection, as shown by FIG. 11A, there poses a problem that on a downstream side of the beam scanner, a beam diameter at an end portion of a scanning region becomes larger than a beam diameter at a center portion of the scanning region. It is defined that the beam diameter signifies a sectional size of the beam in the scanning direction at a plane of reciprocally scanning the ion beam. Further, the end portion of the scanning region is an end portion on the plane of reciprocally scanning the ion beam on a side of being proximate to the scanning electrode and a center portion of the scanning region is a portion along a center axis of the reciprocally scanning plane.

The problem is posed because masses of an ion included in the ion beam and an electron entangled with the ion beam significantly differ from each other. Further, because the larger the beam current density, the larger the forces of the ions repelling each other.

When the beam diameter of the ion beam is changed in a procedure of scanning by electrostatic deflection as described above, whereas when the ion beam passes the center of the scanning region, a density of the ion beam is increased and an amount of implanting the ion to a wafer is increased, the beam density of the ion beam passing the end portion of the scanning region is lowered, and therefore, there poses a problem that a uniformity of implanting an ion to the wafer is deteriorated.

Hence, a change in the density of the ion beam is constituted to restrain when the ion beam passes the center portion of the scanning region by providing a pair of zero electric field correcting electrodes at inside of the beam scanner. However, the scanning electrode and the suppression electrode are not partitioned by the ground potential, and therefore, confinement of the electron in the scanning electrode space is insufficient, and the suppression potential of the suppression electrode effects an influence on a correcting accuracy of the zero electric field correcting electrodes.

Further, in the beam scanner, a scanning electric field generated by the scanning electrode effects a significant influence on front and rear sides and a peripheral portion of the scanning electrode. In consideration thereof, in order to shut off the influence of the scanning electrode to a surrounding, the suppression electrode for confining the electron is provided. Specifically, a shielding suppression electrode assembly is constituted as an assembly electrode comprising one suppression electrode and one ground electrode arranged contiguously to upstream side and downstream side of the suppression electrode. However, as descried above, the scanning electrode and the suppression electrode are not partitioned by the ground potential, and therefore, the electron is not confined sufficiently in the scanning electrode space, and the suppression potential for suppression of the electron at the suppression electrode effects an influence on the scanning accuracy of scanning electrode.

Further, in the scanner housing constituting a vessel for containing the scanning electrode, the zero electric field correcting electrodes, the shielding suppression electrode assembly and the like, suppression electrode structures or space constitutions, or constitutions of connecting to the beam paralleling apparatus effect an influence on the beam accuracy.

Further, according to the beam paralleling apparatus, an accuracy of decelerating and paralleling is further requested.

The above-descried problems are commonly present in the ion implantation apparatus adopting the beam scanner.

Although in an ion implantation apparatus of a high energy and an ion implantation apparatus of a middle current, an influence of the above-descried problems is inconsiderable, in an ion implantation apparatus of a low energy and high current, a uniformity of implanting an ion is further significantly deteriorated, and therefore, a serious problem is posed.

It is an object of the present invention to stabilize ion beam scanning by electrostatic deflection and to be able to maintain an ion beam diameter substantially constant regardless of a position in a scanning region and to promote also an accuracy of beam paralleling after the ion beam scanning.

Aspects of the present invention will be described as follows.

(First Aspect)

A beam processing apparatus according to the present invention includes a beam scanner having a two electrodes type deflection scanning electrode by opposed electrodes of a bilaterally-symmetric shape opposed to each other and having grooves extended in a beam line direction at opposed electrode faces thereof for carrying out deflection scanning of periodically changing an trajectory of a charged particle beam. The beam scanner further includes shielding suppression electrode assemblies respectively at vicinities of upstream side and downstream side of the two electrodes type deflection scanning electrode and having openings in a rectangular shape for passing the charged particle beam. Each of the shielding suppression electrode assemblies is an assembly electrode comprising one sheet of a suppression electrode and two sheets of shielding ground electrodes interposing the suppression electrode. A total of front side portions and rear side portions of the two electrodes type deflection scanning electrode is shielded by the two sheets of shielding ground electrodes.

In the beam processing apparatus according to the first aspect, the two electrodes type deflection scanning electrode and the suppression electrode are partitioned by the ground potential, and therefore, the electron can sufficiently be confined into the two electrodes type deflection scanning electrode space, and the scanning accuracy of the two electrodes type deflection scanning electrode is not influenced by the suppression potential of the suppression electrode. Further, by forming an electron suppression region by the negative side of the two electrodes type deflection scanning electrode and the two suppression electrodes and by surrounding the positive side of the two electrodes type deflection scanning electrode, an unnecessary flow of the electron to inside and outside of the two electrodes type deflection scanning electrode space can be restrained. According to the related art constitution, the electron suppression region is only formed with a narrow region by the negative electrode side of the two electrodes type deflection scanning electrode and the negative electrode side of the two suppression electrodes and a narrow region is formed on the positive electrode side of the two electrodes type deflection scanning electrode and the positive electrode side of the two suppression electrodes. Therefore, two divided regions are formed, and therefore, unnecessary flow of the electron to inside and outside of the two electrodes type deflection scanning electrode space cannot be restrained. In contrast thereto, according to the first aspect, the two electrodes type deflection scanning electrode is interposed by the shielding ground electrodes and is not influenced by the suppression electrode, and therefore, the two electrodes type deflection scanning electrode can be operated to stably scan.

(Second Aspect)

In the beam processing apparatus according to the first aspect, the beam processing apparatus may be constituted such that the two electrodes type deflection scanning electrode includes a beam inlet portion and a beam outlet portion, a maximum width of the beam inlet portion is made to be smaller than a maximum width of the beam outlet portion, and a length in the beam line direction is shorter than the maximum width of the beam inlet portion.

According to the beam processing apparatus of the second aspect, a larger deflection scanning angle can be provided at inside of the beam scanner, an electric field acting on the ion beam in the beam line direction can be minimized, and the beam scanner for the ion beam having the large beam diameter in the lateral direction can be constituted.

(Third Aspect)

In the beam processing apparatus according to the first or the second aspect, heights in a longitudinal direction of the two electrodes type deflection scanning electrode and the shielding suppression electrode assemblies may be constituted to be the same.

According to the beam processing apparatus of the third aspect, shielding of front and rear sides of the two electrodes type deflection scanning electrode can be made to be necessary minimum and sufficient in the longitudinal direction by the shielding suppression electrode assembly and a compact beam scanner can be constituted.

(Fourth Aspect)

In the beam processing apparatus according to the first or the second aspect, a sectional shape of the groove of the opposed electrode may be constituted by a flat face with regard to a region in correspondence with a scanning plane of the charged particle beam and constituted by an inclined face in which an interval of the opposed electrode faces is narrowed as being remote from the flat face region with regard to an upper side and a lower side of the flat face region.

According to the beam processing apparatus of the fourth aspect, an effective width of a scanning electric field in a left and right (lateral) direction constituting the direction of scanning the ion beam can be constituted to be large and also in the longitudinal direction, the scanning electric field can effectively be worked.

(Fifth Aspect)

In the beam processing apparatus according to the first aspect, the suppression electrode may be applied with a constant or a variable direct current voltage independently, and the two sheets of shielding ground electrodes may be grounded to a ground potential.

The beam processing apparatus according to the fifth aspect can constitute the suppression electrode by a fixed potential or a variable potential.

(Sixth Aspect)

In the beam processing apparatus according to the first aspect, a thickness of the electrode in the beam line direction of the suppression electrode may be constituted to be thicker than a thickness of the shielding ground electrode.

The beam processing apparatus according to the sixth aspect can intensify an electron suppression effect of the suppression electrode in the beam line direction.

(Seventh Aspect)

In the beam processing apparatus according to the first aspect, a width of the opening for passing the beam of the shielding suppression electrode assembly on the upstream side of the two electrodes type deflection scanning electrode may be substantially made to be the same as a maximum width of the beam inlet portion of the two electrodes type deflection scanning electrode.

The beam processing apparatus according to the seventh aspect can cut an extruded beam component such that the incident ion beam is confined within the beam inlet portion of the two electrodes type deflection scanning electrode.

(Eighth Aspect)

In the beam processing apparatus according to the first aspect, a width of the opening for passing the beam of the shielding suppression electrode assembly on the downstream side of the two electrodes type deflection scanning electrode may be substantially made to be the same as a maximum width of the beam outlet portion of the two electrodes type deflection scanning electrode.

According to the beam processing apparatus of the eighth aspect, an extruded beam component of the ion beam emitted from the beam outlet portion of the two electrodes type deflection scanning electrode can be cut by an opening for passing the beam of the shielding suppression electrode assembly.

(Ninth Aspect)

In the beam processing apparatus according to the first aspect, shielding members may respectively be arranged on upper and lower sides and left and right sides of the two electrodes type deflection scanning electrode to be grounded to a ground potential and it is desirable that the two electrodes type deflection scanning electrode is shielded from six directions of front and rear directions, upper and lower directions and left and right directions along with the shielding ground electrode.

According to the beam processing apparatus of the ninth aspect, by shielding the two electrodes type deflection scanning electrode from six directions of front and rear, upper and lower, and left and right directions, the scanning electric field of the two electrodes type deflection scanning electrode is not leaked to an outside space, and therefore, an influence on the outside space can almost be eliminated. Further, the electron at inside of the two electrodes type deflection scanning electrode space can further sufficiently be confined, an interference between a scanner housing wall and the two electrodes type deflection scanning electrode can be prevented and scanning with a higher accuracy can be realized.

(Tenth Aspect)

In the beam processing apparatus according to the first or the second aspect, a pair of electric field correcting electrodes extending in a direction orthogonal to an opposing direction of the two electrodes type deflection scanning electrode are arranged at a zone of the two electrodes type deflection scanning electrode and along the beam line direction to be opposed to each other by interposing a center axis of a plane of reciprocally scanning the charged particle beam. In this case, the pair of electric field correcting electrodes are the same as potentials of the upstream side suppression electrode and the downstream side suppression electrode. The pair of electric field correcting electrodes are arranged between the upstream side suppression electrode and the downstream side suppression electrode by penetrating the upstream side shielding ground electrode and the downstream side shielding ground electrode which are close to the two electrodes type deflection scanning electrode. The pair of electric field correcting electrodes are supported and connected conductively or insulatedly to vicinities of center portions of the upstream side suppression electrode and the downstream side suppression electrode.

According to the beam processing apparatus of the tenth aspect, the electric field correcting electrodes can be constituted by the potential the same as that of the suppression electrode or the independent potential, further, also the electric field of the electric field correcting electrodes can be shielded by the ground electrodes. Further, also the electric field correcting electrodes can be shortened, an influence of the electric field correcting electrodes on the scanning electric field can be reduced and also an influence of disturbing the beam trajectory line can be reduced. Further, the electric field correcting electrodes can be made to be present by being partitioned from outside by the shielding ground electrodes between the two electrodes type deflection scanning electrode, and therefore, the electric field correcting electrodes can carry out an electric field correcting operation independently without being assimilated to the suppression electrode.

(Eleventh Aspect)

In the beam processing apparatus according to the tenth aspect, the pair of electric field correcting electrodes apply potentials the same as potentials of the upstream side suppression electrode and of the downstream side suppression electrode, or variable potentials respectively independent from each other.

(Twelfth Mode)

In the beam processing apparatus according to the first or the second aspect, the two electrodes type deflection scanning electrode and the shielding suppression electrode assemblies may be arranged on the beam line by being contained in a scanner housing constituting a vacuum vessel.

According to the beam processing apparatus of the twelfth aspect, the two electrodes type deflection scanning electrode and the shielding suppression electrode assembly can be arranged in a space independent from other constituent elements at inside of the scanner housing constituting the vacuum vessel, and an influence of the electric field of the two electrodes type deflection scanning electrode can be shut out by isolating from other constituent element.

(Thirteenth Mode)

In the beam processing apparatus according to the twelfth aspect, a maximum width of a beam inlet portion of the scanner housing may be constituted to be substantially the same as the maximum width of the beam inlet portion of the two electrodes type deflection scanning electrode.

According to the beam processing apparatus of the thirteenth aspect, the ion beam having a larger beam diameter in the lateral direction can be made to be incident on the scanner housing.

(Fourteenth Aspect)

In the beam processing apparatus according to the twelfth aspect, a beam outlet portion of the scanner housing may be connected with a parallel lens housing containing a parallel lens and a maximum width of the beam outlet portion of the scanner housing is constituted to be substantially the same as a maximum width of the beam inlet portion of the parallel lens.

According to the beam processing apparatus of the fourteenth aspect, the ion beam at the end portion of the scanning region can be made to be incident on the beam inlet portion of the parallel lens without being cut. In the related art, the beam inlet portion of the parallel lens is slightly narrower than the beam outlet portion of the scanner housing, and therefore, there is a case in which a portion of the ion beam is cut at the end portion of the scanning region.

(Fifteenth Aspect)

In the beam processing apparatus according to the twelfth aspect, a beam outlet portion of the scanner housing may be connected with a parallel lens housing containing a parallel lens, the parallel lens is constituted to be equal to or smaller than a deceleration ratio of 1:3, and a quasi radius of curvature of a noncircular curve of the parallel lens may be constituted to be large.

The beam processing apparatus according to the fifteenth aspect uses the parallel lens having a small deceleration ratio increasing the quasi radius of curvature of the noncircular curve lens by lowering a decelerating effect and the beam converging effect of the ion beam. Thereby, the more proximate to the both side end portions of the parallel lens, the shallower the angle of incidence of the ion beam to the parallel lens can be made, the deceleration effect can be promoted, the ion beam can considerably be deflected to a beam trajectory line in parallel with the original beam trajectory line before deflection and diversion of the ion beam can be restrained as less as possible.

According to the present invention, the ion beam scanning in scanning by electrostatic deflection can be stabilized, the ion beam diameter can be maintained substantially constant regardless of the position at inside of the scanning region and also an accuracy of paralleling the beam after scanning the ion beam can be promoted.

BRIEF DESCRIPTION OF THE DRAWINGS

FIG. 2A is a plane view of a total, and FIG. 2B is a side view thereof;

DETAILED DESCRIPTION OF THE PREFERRED EMBODIMENTS

An explanation will be made with respect to an embodiment of an ion implantation apparatus according to the present invention in reference to the drawings as follows.

Figure 1A:
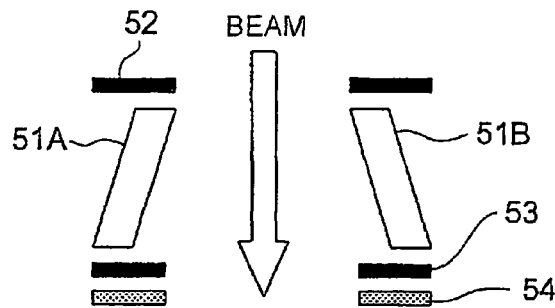
FIG. 1A through FIG. 1D are views for explaining an operation of a beam scanner of a related art.
Figure 1B:
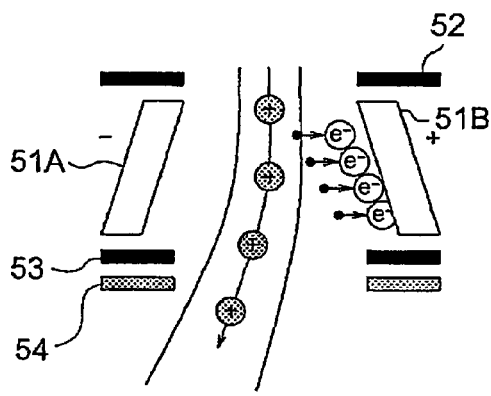
Figure 1C:
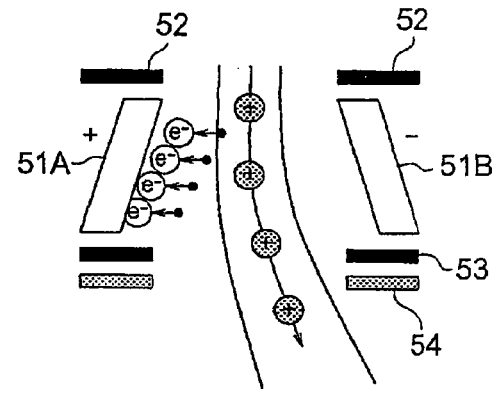
Figure 1D:
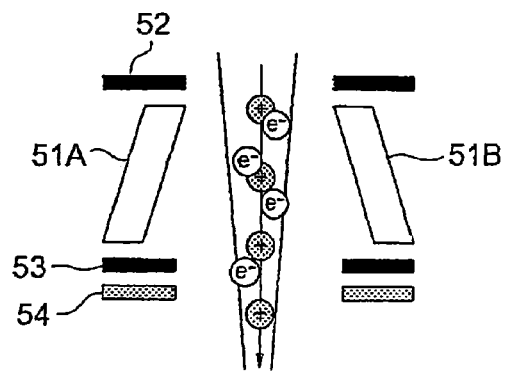
Figures 2A, 2B:
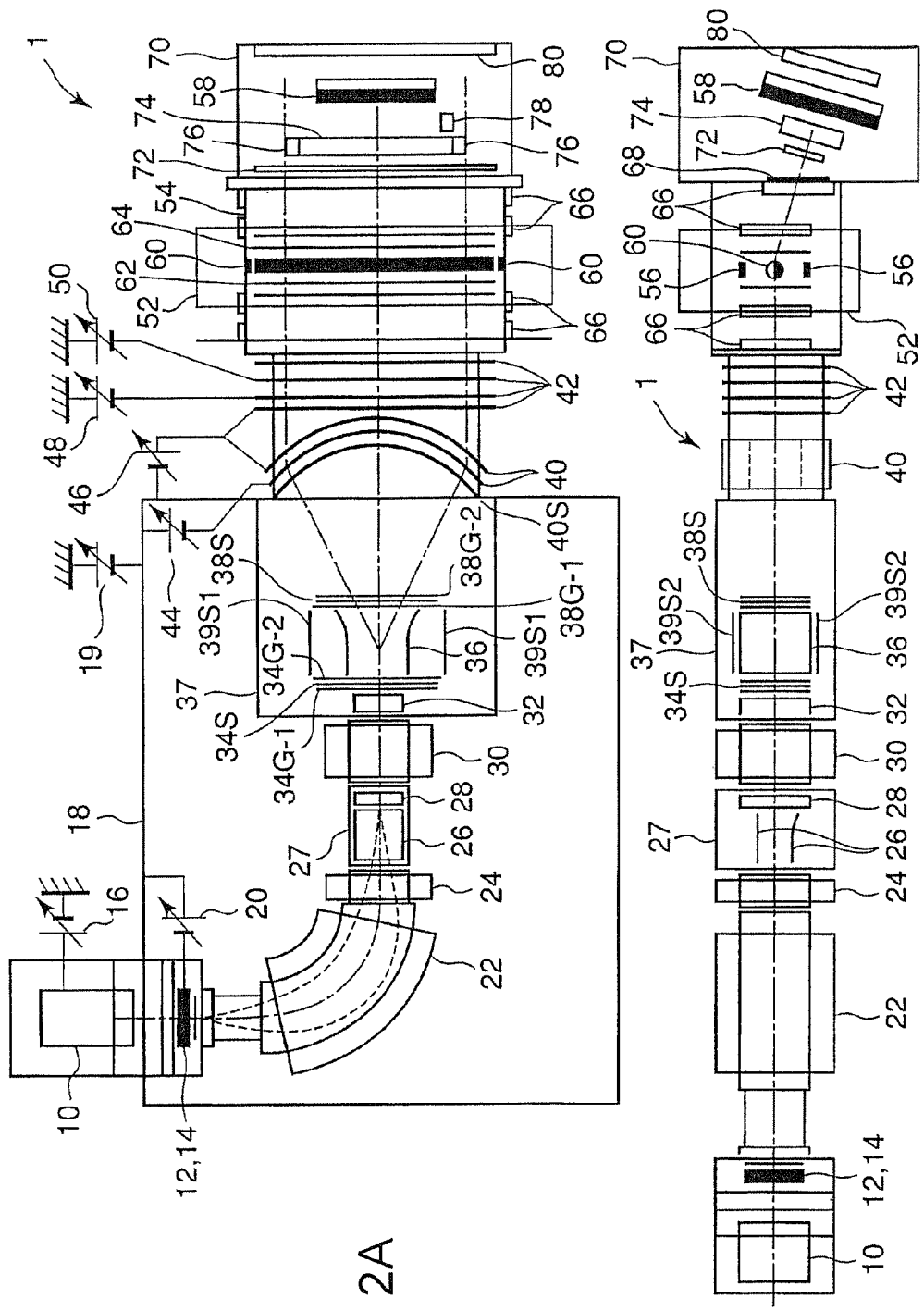
FIG. 2A and FIG. 2B are views showing an outline constitution of an ion implantation apparatus to which the present invention is applied.

FIG. 2A and FIG. 2B are schematic views when an electrostatic type beam scanner (hereinafter, abbreviated as beam scanner) and a beam paralleling electrode lens apparatus (beam paralleling apparatus or parallel lens, hereinafter, abbreviated as parallel lens) according to the present invention are applied to a processing apparatus by a charged particle beam, particularly, a single wafer type ion implantation apparatus and a large current ion implantation apparatus of a low energy, and FIG. 2A is a plane view. FIG. 2B is a side view of FIG. 2A, and a path between an ion source and a mass analysis magnet apparatus is shown by being extended linearly for convenience of an explanation.

A constitution of an ion implantation apparatus 1 will be explained from a most upstream side of a beam line constituting a start point by an ion source 10. An outlet side of the ion source 10 is provided with an extracting electrode 12 for extracting an ion beam from a plasma generated at inside of an ion chamber. A vicinity of a downstream side of the extracting electrode 12 is provided with an extracting suppression electrode 14 for restraining an electron included in the ion beam extracted from the extracting electrode 12 from flowing back to the extracting electrode 12. The ion source 10 is connected with an ion source high voltage power source 16 and an extracting power source 20 is connected between the extracting electrode 12 and a terminal 18.

A downstream side of the extracting electrode 12 is arranged with a mass analysis magnet apparatus 22 for separating a predetermined ion from the incident ion beam and extracting an ion beam comprising the separated ion. A downstream side of the mass analysis magnet apparatus 22 is arranged with a first quadrupole vertical focusing electromagnet 24 for converging or focusing the ion beam in a longitudinal (vertical) direction, a park electrode 26 for deflecting the ion beam in a direction of being deviated from a beam trajectory line, a mass analysis slit 28 for passing an ion beam comprising an ion having a predetermined mass in the ion beam, and a second quadrupole vertical focusing electromagnet 30 for converging or focusing the ion beam in the longitudinal direction. The park electrode 26 and the mass analysis slit 28 are contained in a park housing 27 comprising a material in which cross contamination of aluminum or the like is hardly present. Further, as the mass analysis slit 28, other than an exclusive slit of a fixed type, a mass analysis slit of a plurality of stages of switching type is used. According to the mass analysis slit of the plurality of stages of switching type, three stages of slit sizes of, for example, an elliptical and/or oval type slit for a high beam current, a long and narrow circular slit for a low beam current, and an extremely small diameter slit for confirming a beam trajectory axis are mechanically switched.

A downstream side of the second quadrupole vertical focusing electromagnet 30 is arranged with an injector flag Faraday cup 32 for shutting off the ion beam as necessary and measuring a beam current, and a beam scanner 36 for periodically scanning reciprocally the ion beam in a horizontal direction orthogonal to an ion beam advancing direction (beam line direction). As explained later in details, an upstream side and a downstream side of the beam scanner 36 are respectively provided with suppression electrodes 34S and 38S for restraining the ion beam from being diverged and restricting a sectional size of the ion beam. Upstream sides and downstream sides of the suppression electrodes 34S and 38S are respectively provided with shielding ground electrodes 34G-1, 34G-2, 38G-1, 38G-2. Further, the injector flag Faraday cup 32 is made to be able to be brought in and out to and from the beam line, in this case, by a drive mechanism in the up and down direction as explained later. Further, the injector flag Faraday cup 32, the beam scanner 36 and the suppression electrodes 34S and 38S, and the shielding ground electrodes 34G-1, 34G-2 38G-1, 38G-2 are contained in a scanner housing 37 comprising aluminum.

Respective constituent elements from the extracting electrode 12 to the scanner housing 37 are contained in the terminal 18, and the terminal 18 is connected with a terminal power source 19. Therefore, potentials of the park housing 27 and the scanner housing 37 are the same as a potential of the terminal 18 to constitute a potential of the terminal power source 19.

Figures 3A, 3B:
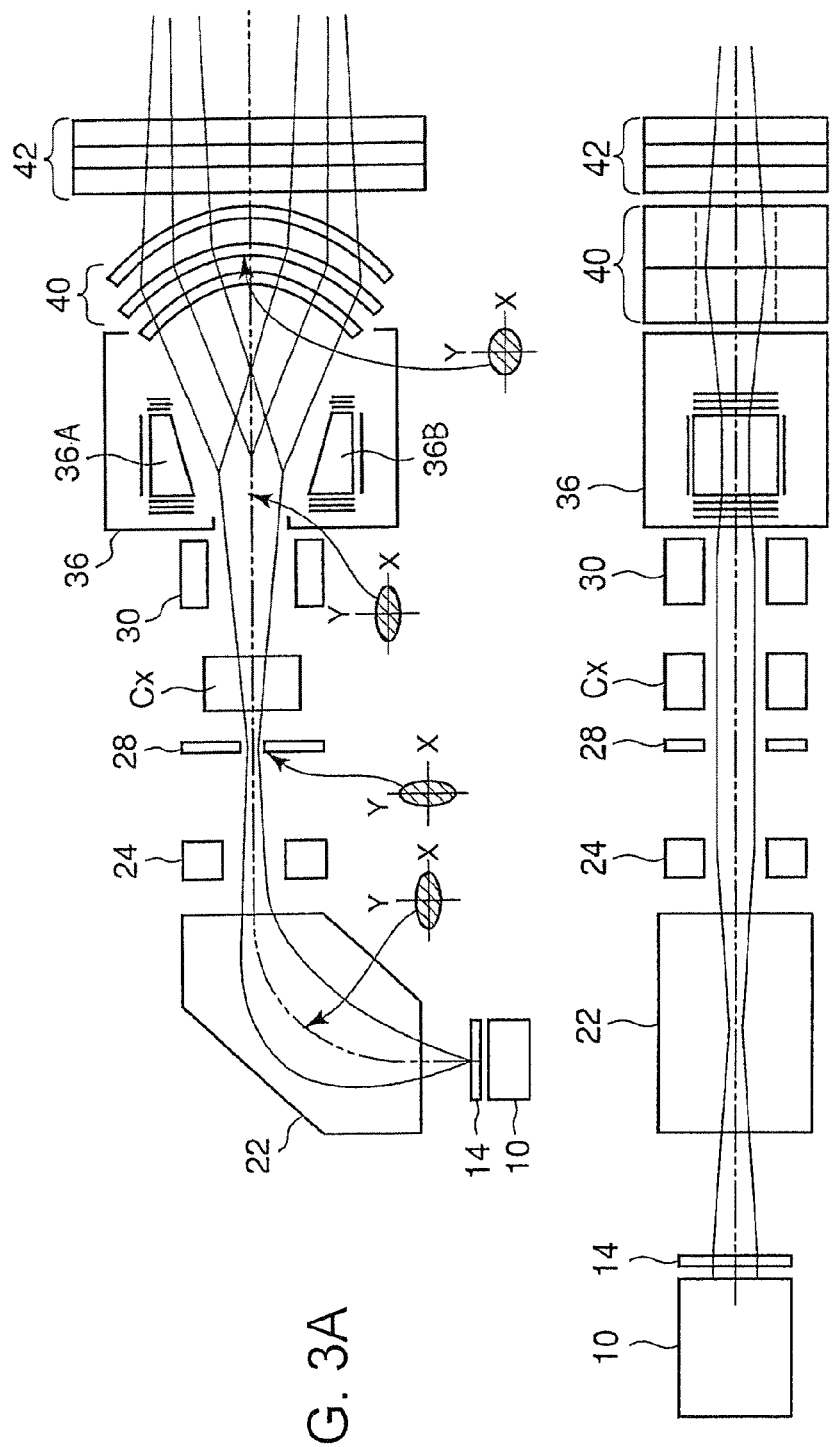
FIG. 3A is a plane view for schematically explaining an operational procedure of converging and diverging and shaping of the ion beam from an ion source to an accelerating/decelerating column shown in FIG. 2A.
FIG. 3B is a view viewing FIG. 3A from a side face thereof.

FIG. 3A and FIG. 3B show sectional shapes of the ion beam at a center position of the mass analysis magnet apparatus 22, the mass analysis slit 28, the beam scanner 36 and a parallel lens (beam paralleling apparatus) 40 by being extended by extensions. With regard to X, Y attached to the sectional shapes, notation X designates a lateral (left and right or horizontal) direction, notation Y designates a longitudinal (vertical) direction.

The beam scanner 36 reciprocally and periodically deflects (scans) the ion beam having an elliptical sectional shape or a flat sectional shape of which is prolonged in the lateral direction provided as described above in the lateral direction. The ion beam is paralleled again to be in parallel with the beam trajectory line before being incident on the beam scanner 36 (before being deflected) by the parallel lens 40 having a noncircular curve shape. That is, the ion beam is made to be in parallel with an axis having an angle of deflection of 0 degree. Further, the ion beam at a position of the parallel lens 40 is constituted by a sectional shape proximate to a circular shape. The ion beam from the parallel lens 40 is transmitted to AEF 52 (FIG. 2A) by way of an accelerating/decelerating column 42 comprising one or more of electrodes. At AEF 52, analysis with regard to an energy of the ion beam is carried out and only an ion kind of a necessary energy is selected.

A downstream side of the beam scanner 36 will be explained further in details.

As described above, the downstream side of the beam scanner 36 is arranged with the parallel lens 40 for deflecting again the ion beam deflected to have an angle in the horizontal direction orthogonal to the beam trajectory line before being deflected, that is, the beam line to be in parallel with the beam trajectory line, and the accelerating/decelerating column 42 for accelerating or decelerating the ion beam. The parallel lens 40 is constituted by a plurality of electrodes in a circular arc shape provided with holes for passing the ion beam at centers thereof, and a first electrode from the upstream side is maintained at the terminal potential. A second electrode from the upstream side is referred to as a suppression electrode and is connected with a suppression power source 44 for restraining an electron from flowing in. A third electrode is connected with a parallel lens power source 46, an electric field is generated by the second electrode and the third electrode and an ion beam deflected in a horizontal direction becomes an ion beam in parallel with the beam trajectory line before being deflected (ion beam advancing direction). The parallel lens 40 is constituted by the plurality of electrodes in the circular arc shape provided with the holes for passing the ion beam at the centers, and the first sheet of a suppression inlet electrode 40S from the upstream side is maintained at the terminal potential. The second sheet of the electrode is referred to as a decelerating electrode and connected with a suppression power source 44 and restrains an electron from flowing in by a potential difference between the first sheet of the suppression inlet electrode 40S and the second sheet of the decelerating electrode (several kV: the potential difference becomes a suppression potential). The third sheet of the electrode is connected with the parallel lens power source 46, an electric field for deceleration is generated by the second sheet of the decelerating electrode and the third sheet of the difference electrode by a potential difference from the terminal potential (corrected by the suppression potential) and the ion beam deflected in the horizontal direction becomes the ion beam in parallel with the beam trajectory line before being deflected (ion beam advancing direction).

The accelerating/decelerating column 42 is constituted by one or more of electrodes in a linear shape. A first electrode from an upstream side of the accelerating/decelerating column 42 is connected with the parallel lens power source 46 similar to the third electrode of the parallel lens 40. Second and third electrodes are respectively connected with a first accelerating/decelerating column power source 48 and a second accelerating/decelerating column power source 50. The ion beam is accelerated or decelerated by adjusting voltages of the power sources. Further, a fourth electrode is grounded to a ground potential.

A downstream side of the accelerating/decelerating column 42 is arranged with an angular energy filter (hereinafter, referred to as AEF) 52 of a hybrid type. AEF 52 is an energy filter for selecting the ion beam achieving an aimed acceleration energy. AEF 52 includes a magnetic deflecting electromagnet for magnetic field deflection and a static deflecting electrode for static deflection. The magnetic deflecting electromagnet is arranged to surround an AEF chamber 54 and is constituted by a yoke member surrounding upper and lower and left and right sides of the AEF chamber 54 and a group of coils wound around the yoke member. Further, the magnetic deflecting electromagnet is connected with a direct current voltage power source (not illustrated).

On the other hand, the static deflecting electrode is constituted by a pair of upper and lower AEF electrodes 56 and arranged to interpose an ion beam from up and down directions. In the pair of AEF electrodes 56, the AEF electrode 56 on an upper side is applied with a positive voltage and the AEF electrode 56 on a lower side is applied with a negative voltage, respectively. In deflecting by a magnetic field, an ion beam is deflected to a lower side by about 20 degrees by the magnetic field from the magnetic deflecting electromagnet and only an ion beam of an aimed energy is selected. On the other hand, in deflecting by the magnetic field and the electric field, the ion beam is deflected to the lower side by about 20 degrees by a combining operation by the magnetic field from the magnetic deflecting electromagnet and the electric field generated between the pair of AEF electrodes 56, and only an ion beam of an aimed energy is selected.

In this way, AEF 52 is of the hybrid type using the magnetic field, and both of the magnetic field and the electric field as necessary, and therefore, in transporting a low energy beam, the magnetic field having a high electron confining effect can mainly be used and in transporting a high energy beam, both of the magnetic field deflection and the static deflection can be used. Further, a way of use differs by an energy or a kind of a gas of the ion source 10 when the magnetic field is always used, or when both of the magnetic field and the electric field are used.

AEF 52 is provided with an AEF plasma shower 60 for promoting an efficiency of transporting an ion beam to a wafer 58 by restraining diversion of the ion beam by supplying an electron. Further, AEF 52 is respectively provided with AEF suppression electrodes 62 and 64 on an upstream side and a downstream side of the AEF plasma shower 60. The AEF suppression electrodes 62 and 64 mainly serve to restrict an electron barrier and a size of a sectional shape of the ion beam.

A wall of the AEF chamber 54 is arranged with a plurality of permanent magnets 66 for forming a cusp magnetic field. By forming the cusp magnetic field, an electron is confined to inside of the AEF chamber 54. The respective permanent magnets 66 are arranged such that magnetic poles thereof are directed to inside of the AEF chamber 54 and the contiguous magnetic poles have opposite magnetic poles. Further, an outlet side of the AEF chamber 54 is provided with a striker plate 68 for receiving a neutral particle or the like constituted by neutralizing an ion advancing straight without being deflected by AEF 52.

A processing chamber (vacuum processing chamber) 70 is connected with the AEF chamber 54. Selectable energy slits (hereinafter, referred to as SES) 72 are arranged at inside of the processing chamber 70. The selectable energy slits 72 are arranged to interpose the ion beam from up and down directions. Upper and lower selectable slits each includes 4 of slit faces, after selecting the slit face, by further adjusting axes of the upper and lower selectable slits in the up and down direction, and rotating the axes, a desired slit width is provided. By successively selecting 4 of the silt faces in accordance with a species of an ion, cross contamination is reduced.

A plasma shower 74 supplies a low energy electron to a front face of the wafer 58 along with the ion beam, neutralizes and restrains charge up of a positive charge produced by ion implanting. Dose cups 76 respectively arranged at left and right ends of the plasma shower 74 measure a dose amount. Specifically, the dose cup is connected with a current measuring circuit and the dose amount is measured by measuring a beam current which flows by making the ion beam incident thereon.

A beam profiler 78 includes a beam profiler cup (not illustrated) for measuring the beam current at an ion implanting position and a vertical profile cup (not illustrated) for measuring a beam shape and a beam X-Y position. The beam profiler 78 measures an ion beam density at the ion implanting position while being moved in a horizontal direction before implanting an ion or the like. When a predicted non uniformity (PNU) of the ion beam does not satisfy a request of the process as a result of measuring the beam profile, an applied voltage or the like of the beam scanner 36 is automatically adjusted to satisfy a process condition. The vertical profiler cup confirms a beam width and a beam center position by measuring the beam shape at the ion implanting position.

The most downstream side of the beam line is arranged with a triple surface beam dump (TSBD) 80 having a beam current measuring function similar to that of a Faraday cup for measuring a final setup beam. The triple surface beam dump 80 reduces cross contamination by switching three faces of a triangular pillar in accordance with a kind of a gas of the ion source 10. Further, the beam line is naturally maintained in high vacuum.

Further, FIG. 2A shows that a semiconductor wafer 58 is reciprocally moved in the up and down direction intersected with a face of the drawing, and FIG. 2B shows that the semiconductor wafer 58 is reciprocally moved, that is, mechanically scanned upward from a face direction of the drawing. That is, when the ion beam is assumed to be scanned reciprocally in, for example, one axis direction, the semiconductor wafer 58 is driven to reciprocally move in a direction orthogonal to the one axis direction by a drive mechanism, not illustrated.

Figure 4:
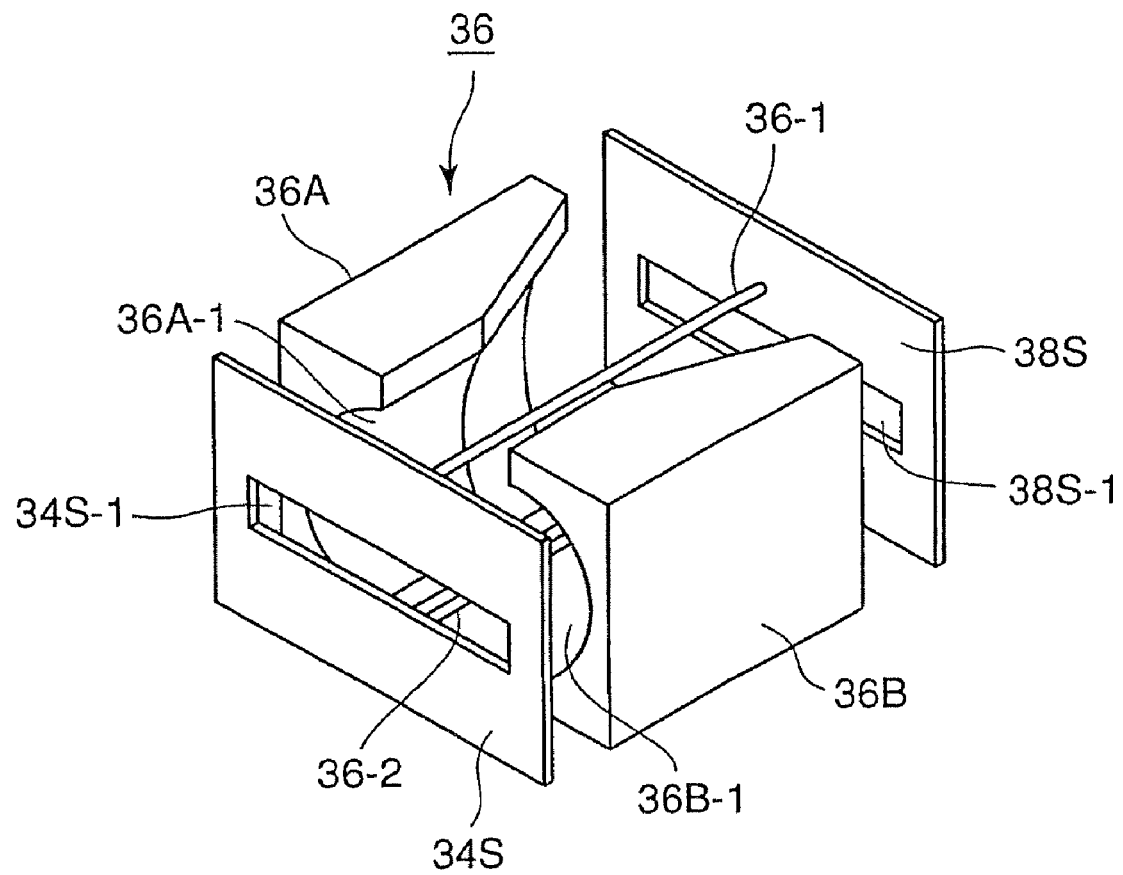
FIG. 4 is a perspective view showing an outline constitution of the beam scanner according to the invention.

FIG. 4 is a perspective view showing a basic constitution of the beam scanner 36 of the two electrodes type and basic constitutions of a shielding suppression electrode assembly and a pair of electric field correcting electrodes (zero electric field correcting electrodes). The beam scanner 36 includes a pair of scanning electrodes 36A and 36B arranged to be opposed to each other by interposing the ion beam, and the suppression electrodes 34S and 38S provided at upstream side vicinities and downstream side vicinities of the pair of scanning electrodes 36A and 36B respectively to interpose the scanning electrodes 36A and 36B. The beam scanner 36 further includes electric field correcting electrodes 36-1 and 36-2 extended in parallel with the beam trajectory line, connected to the suppression electrodes 34S and 38S and provided at inside of a space interposed by opposed electrode faces of the pair of scanning electrodes 36A and 36B. That is, here, the electric field correcting electrodes 36-1 and 36-2 are supported by and connected to the suppression electrodes conductively or insulatedly and constituted to be able to apply a negative potential the same as those of the suppression electrodes 36S and 38S or an independent variable potential. Further, the scanning electrodes 36A and 36B are provided with shapes symmetrical with each other with regard to the beam trajectory line before being deflected (ion beam advancing direction) or a center axis in a reciprocally scanning plane, and faces (opposed electrode faces) thereof on sides of the ion beam are arranged to be symmetrical with each other with regard to the center axis. The opposed electrode faces of the scanning electrodes 36A and 36B are provided with grooves 36A-1 and 36B-1 respectively extended in the beam line direction to constitute recessed shape opposed electrodes and an interval between inner faces of the grooves is made to be increased as proceeding to the downstream side from a midway thereof. Naturally, a groove shape increasing the interval linearly not from the midway but from the upstream side to the downstream side will do, and such a scanning electrode is shown in, for example, FIG. 5A and FIG. 5B to be explained successively. Further, the suppression electrodes 34S and 38S respectively include openings 34S-1 and 38S-1 in a laterally prolonged rectangular shape at regions thereof for passing the ion beam, and applied with a direct current voltage of about −1 through −2 kV. In the drawing, for convenience of explanation, illustration of the shielding ground electrodes installed respectively contiguous to upstream sides and downstream sides of the suppression electrodes 34S and 38S is omitted.

Figure 5A:
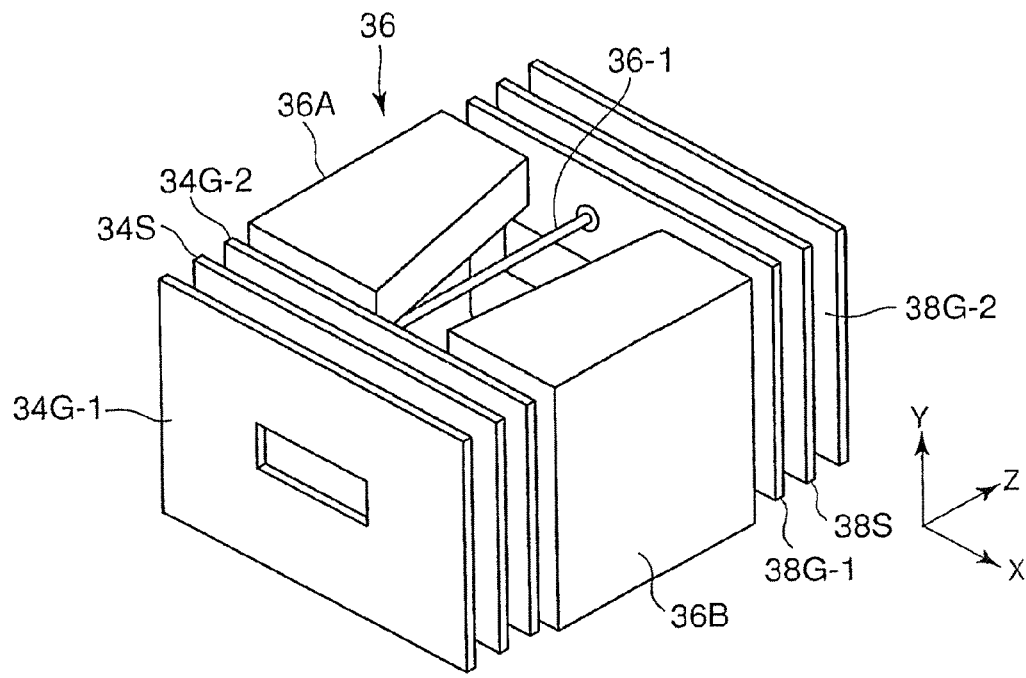
FIG. 5A is a perspective view showing outlines of a shielding suppression electrode assembly and electric field correcting electrodes of the beam scanner.
Figure 5B:
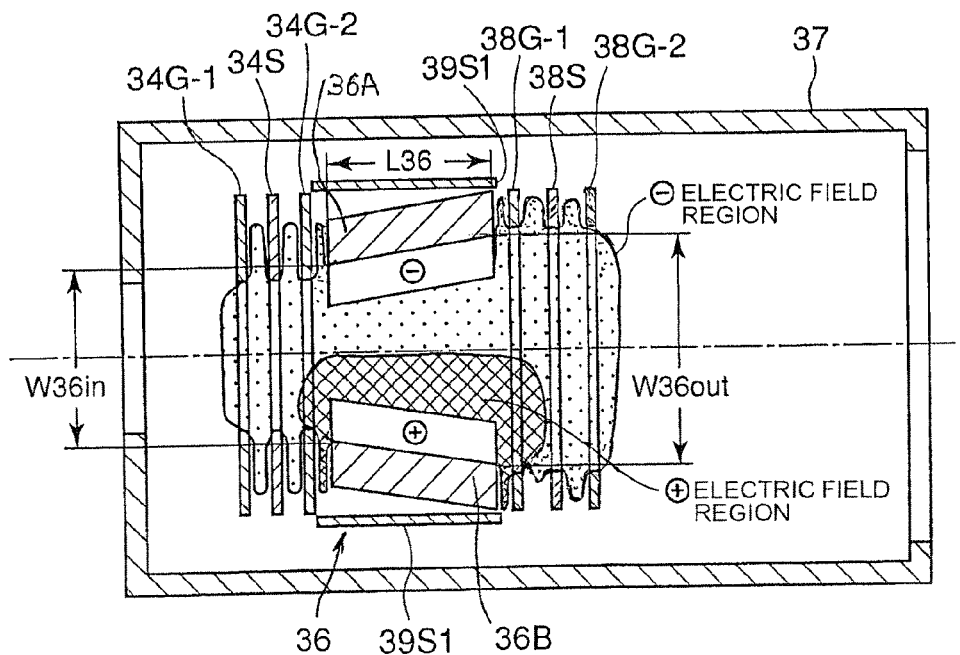
FIG. 5B is a cross-sectional view for explaining an operation of the shielding suppression electrode assembly of the beam scanner according to the present invention.

FIG. 5A is a perspective view showing a constitution of adding the shielding ground electrode to the beam scanner 36 of FIG. 4 and FIG. 5B is a cross-sectional view showing a constitution of containing the beam scanner 36 of FIG. 5A in the scanner housing 37.

Figure 6:
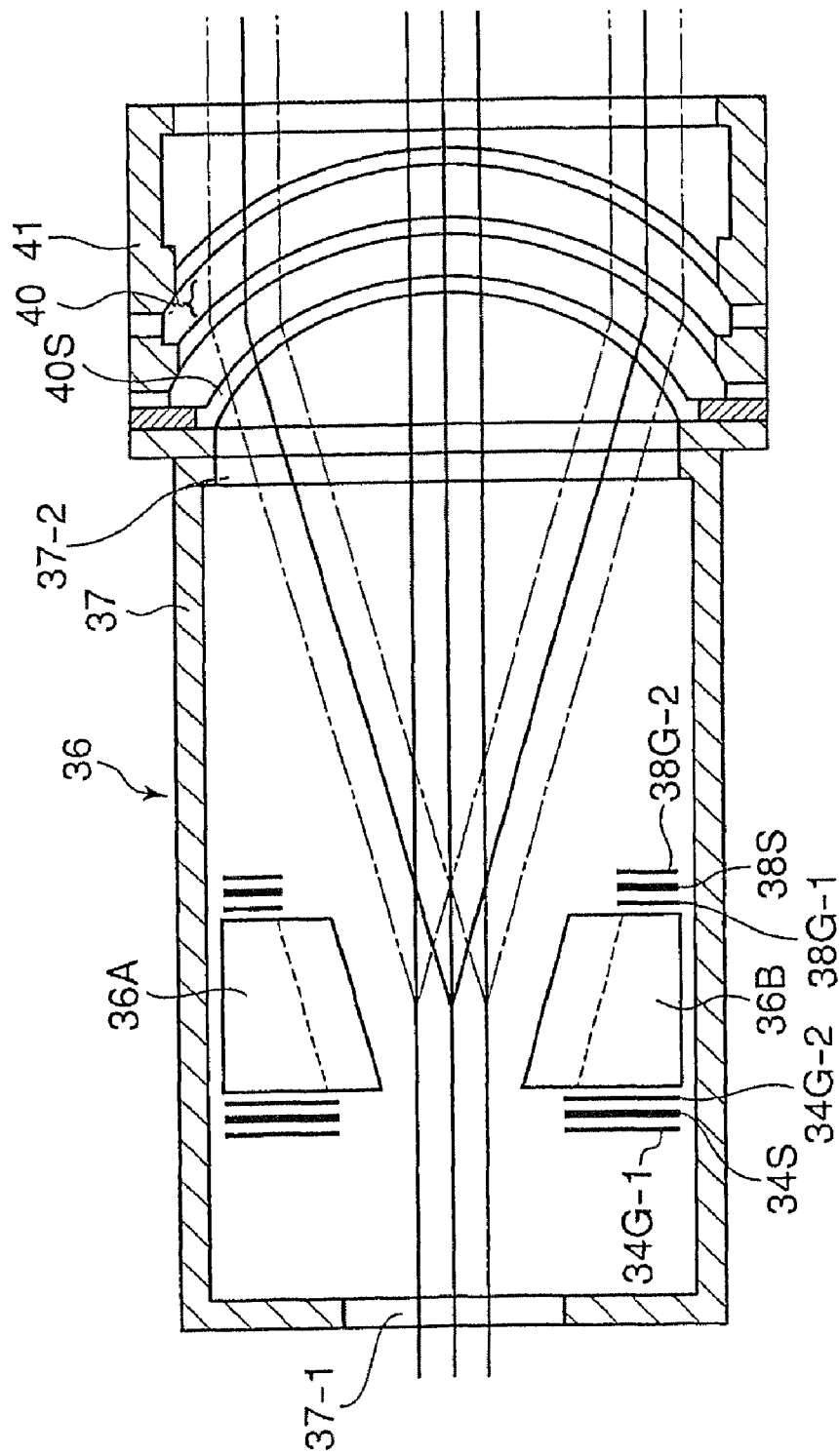
FIG. 6 is a cross-sectional view showing an outline constitution of a beam scanner and a beam paralleling apparatus according to the invention.

FIG. 6 is a cross-sectional view showing a constitution of adding the parallel lens 40 to the scanner housing 37 of FIG. 5B.

Upstream sides and downstream sides of the scanning electrodes 36A and 36B are contiguously arranged with shielding suppression electrode assemblies respectively having openings in a rectangular shape for passing the beam. Respective shielding suppression electrode assemblies are constituted as assembly electrodes each comprising one sheet of the suppression electrode 34S or 38S and two sheets of the shielding ground electrodes 34G-1 and 34G-2, or 38G-1 and 38G-2 interposing the suppression electrodes and totals of portions of front sides and rear sides of the scanning electrodes (recessed shape opposed electrodes) 36A and 36B in a symmetrical shape (bilaterally-symmetric shape) in a left and right direction are shielded by respective two sheets of the shielding ground electrodes 34G-1 and 34G-2 as well as 38G-1 and 38G-2.

Therefore, as shown by FIG. 5B, an electron suppression region (indicated by pear-skin pattern) constituting a negative electric field region is formed by sides of the scanning electrodes constituting negative electrodes and the two suppression electrodes 34S and 38S to surround a side of a positive electric field region (indicated by netted pattern) constituting positive electrodes of the scanning electrodes. Thereby, unnecessary flows of the electrons to inside and outside of the scanning electrode space can be restrained. According to the related art, in an electron suppression region constituting a negative electric field region, only a narrow negative electric field region is formed from a side of a scanning electrode constituting a negative electrode over to sides of negative electrodes of the two suppression electrodes and a narrow positive electric field region is formed similarly on a side of the scanning electrode constituting a positive electrode and sides of positive electrodes of the two suppression electrodes. As a result, two divided electric field regions are formed and unnecessary flows of electrons to inside and outside of the scanning electrode space cannot be restrained. According to the beam scanner of the embodiment, the scanning electrode is interposed by the shielding ground electrodes and is not effected with an influence of the suppression electrodes, and therefore, scanning by the scanning electrode can stably be operated.

As shown by FIG. 5A, heights in a longitudinal (up and down) direction of the scanning electrodes 36A and 36B and the shielding suppression electrode assemblies are constituted to be the same to realize compact formation in the longitudinal direction. On the other hand, as shown by FIG. 5B, the scanning electrodes 36A and 36B by the recessed shape opposed electrodes of a symmetrical shape in a left and right direction are constituted such that a maximum width W36in of a beam inlet portion thereof is made to be smaller than a maximum width W36out of a beam outlet portion and a length L36 of the scanning electrode in the beam line direction is constituted to be shorter than the maximum width W36 in of the beam inlet portion. Thereby, there is constituted a beam scanner for the ion beam providing a large scanning angle (deflecting angle), minimizing an electric field acting on the ion beam in the beam line direction and having a large beam diameter in a lateral direction.

Further, the suppression electrodes 34S and 38S are respectively applied with fixed or variable direct current voltages independently from each other, the shielding ground electrodes 34G-1, 34G-2, 38G-1, 38G-2 are grounded to ground potential, and the suppression electrodes 34S and 38S are constituted by fixed potentials or variable potentials.

Further, electrode thicknesses in the beam line direction of the suppression electrodes 34S and 38S are constituted to be thicker than those of the shielding ground electrodes to thereby intensify a suppression effect of the electron by the suppression electrode in the beam line direction.

As can be understood by FIG. 5B, a width of an opening for passing the ion beam of the shielding suppression electrode assembly on an upstream side of the scanning electrodes 36A and 36B is made to be substantially the same as the maximum width W36 in of the beam inlet portion of the scanning electrodes 36A and 36B. Thereby, an extruded beam component of the ion beam incident on the shielding suppression electrode assembly on the upstream side is cut to be confined within the inlet portion of the scanning electrodes 36A and 36B. On the other hand, a width of the opening for passing the beam of the shielding suppression electrode assembly on the downstream side of the scanning electrodes 36A and 36B is made to be substantially the same as the maximum width W36out of the beam outlet portion of the scanning electrodes 36A and 36B. Thereby, the extruded beam component of the ion beam emitted from the outlet portion of the scanning electrodes 36A and 36B is cut by the opening for passing the beam of the shielding suppression electrode assembly.

Figure 7A:
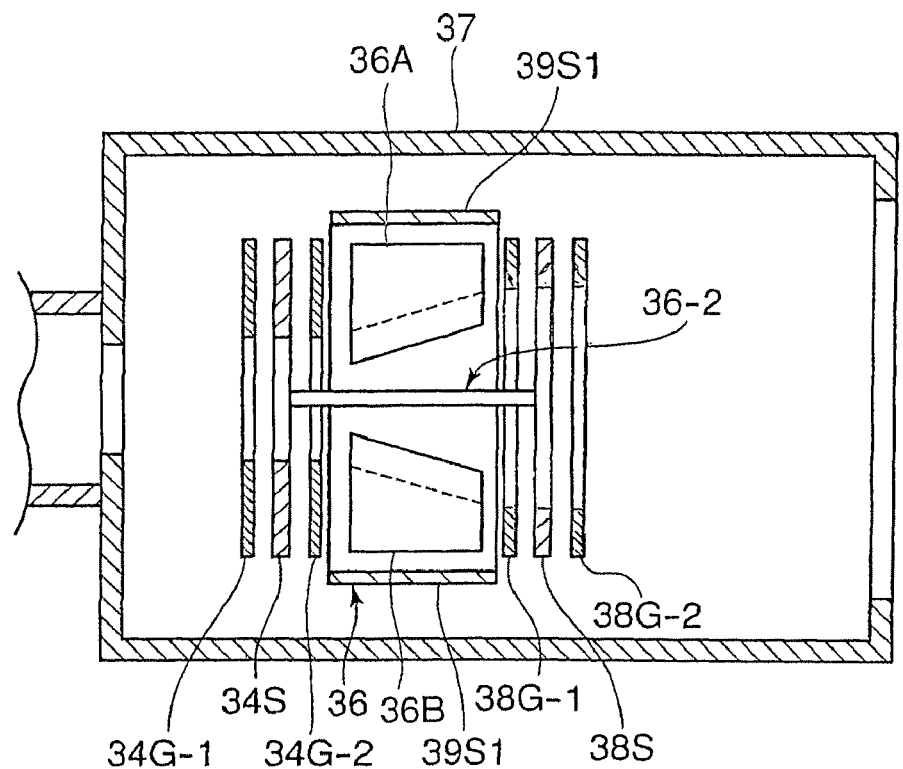
FIG. 7A is a cross-sectional view for explaining electric field correcting electrodes of a beam scanner according to the present invention.
Figure 7B:
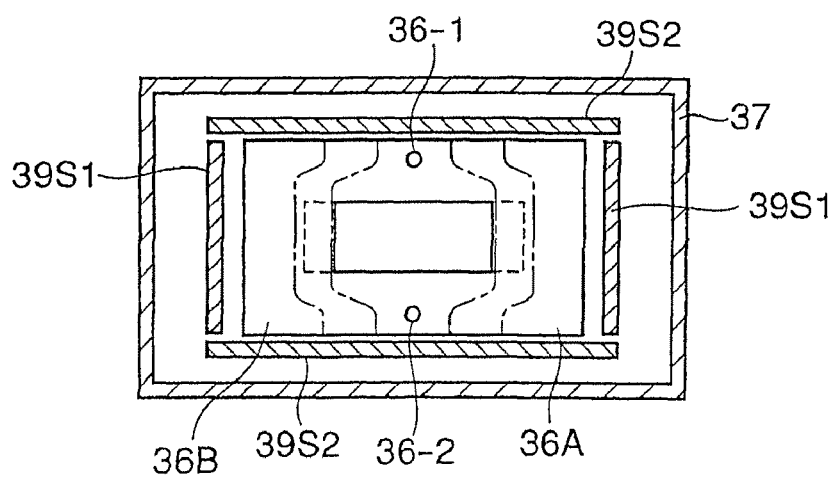
FIG. 7B is a vertical sectional view viewing the beam scanner from an ion beam incident direction.

Shielding members in an up and down and in a left and right direction (only a shielding member 39S1 in a left and right direction is shown in FIG. 5B and a shielding member 39S2 in an up and down direction is shown in FIG. 7B) are respectively arranged in the vicinity of the scanning electrodes 36A and 36B, and grounded to a ground potential, and by shielding the scanning electrodes 36A and 36B along with the shielding ground electrodes from six directions of front and rear and up and down and left and right directions, a scanning electric field of the scanning electrodes 36A and 36B is prevented from being leaked to a space other than the scanning electrodes. Thereby, an influence to a space outside of the scanning electrodes is almost eliminated, electrons are further fully confined into the scanning electrode space, and an interference between a wall of the scanner housing 37 and the scanning electrodes 36A and 36B is prevented.

Further, as shown by FIG. 7A and FIG. 7B, the electric field correcting electrodes 36-1 and 36-2 for restraining zero electric field effect are provided between the suppression electrodes 34S and 38S. However, the downstream side of the suppression electrode 34S and the upstream side of the suppression electrode 38S are respectively provided with the shielding ground electrodes 34G-2 and 38G-1. Therefore, upper and lower sides of the shielding ground electrodes 34G-2 and 38G-1 are respectively formed with through holes through which the electric field correcting electrodes 36-1 and 36-2 are penetrated and the electric field correcting electrodes 36-1 and 36-2 are locked and supported by the suppression electrodes 34S and 38S by penetrating the shielding ground electrodes 34G-2 and 38G-1. Therefore, the electric field correcting electrodes 36-1 and 36-2 are present in a state of being partitioned from outside by the shielding ground electrodes 34G-2 and 38G-1 between the scanning electrodes 36A and 36B and carries out an electric field correcting operation independently without being assimilated to the suppression electrodes 34S and 38S.

Further, as shown by FIG. 7B, according to the example, sectional shapes of the grooves 36A-1 and 36B-1 of the scanning electrodes (recessed shape opposed electrodes) 36A and 36B are constituted not by substantially a circular arc shape but by substantially a trapezoidal shape. That is, the sectional shapes of the grooves 36A-1 and 36B-1 are constituted by flat faces at a region in correspondence with a scanning plane of the ion beam and at a vicinity thereof and is constituted by an inclined face in which an interval between opposed electrodes faces is narrowed as being remote from the flat face region with regard to an upper side and a lower side. According to the scanning electrode, an effective width of a scanning electric field in a left and right (lateral) direction constituting a direction of scanning the ion beam can be constituted to be large and also in the longitudinal (up and down) direction, the scanning electric field can effectively be worked. Further, there may be constructed a configuration in which respective two sheets of electrodes are arranged on upstream sides and downstream sides of the scanning electrodes 36A and 36B, respective one sheets of the upstream sides and the downstream sides of sides of the scanning electrodes 36A and 36B are constituted by suppression electrodes to be applied with a direct current voltage of about −1 through −2 kV and other sheets of the upstream sides and the downstream sides are constituted by ground electrodes to be grounded.

The above-described arrangement is only an example and the arrangement of the scanning electrodes 36A and 37B are not limited to the configuration of being aligned to arrange in the horizontal direction. For example, the scanning electrodes 36A and 36B may be aligned to arrange in a vertical direction. Further, the suppression electrodes on the upstream side and the downstream side need not to be constituted by the same shape.

FIG. 8A through FIG. 8C and FIG. 9 are views for explaining a zero electric field effect restraining operation by the beam scanner 36 according to the present invention.

Figure 8A:
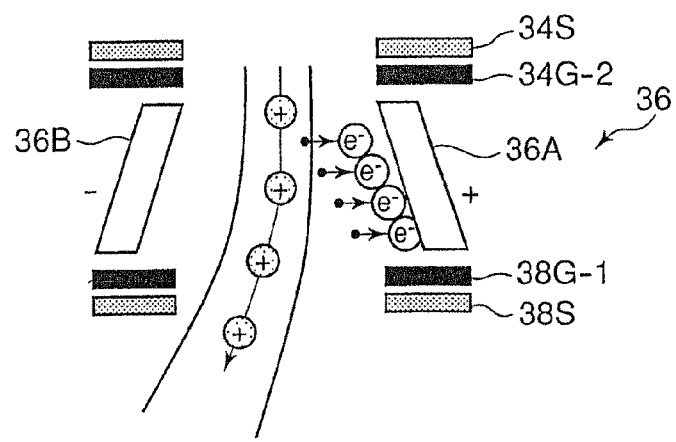
FIG. 8A through FIG. 8C are views for explaining an operation of the beam scanner according to the present invention.
Figure 8B:
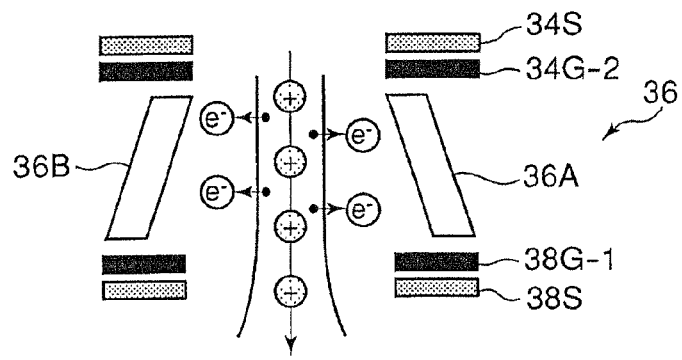
Figure 8C:
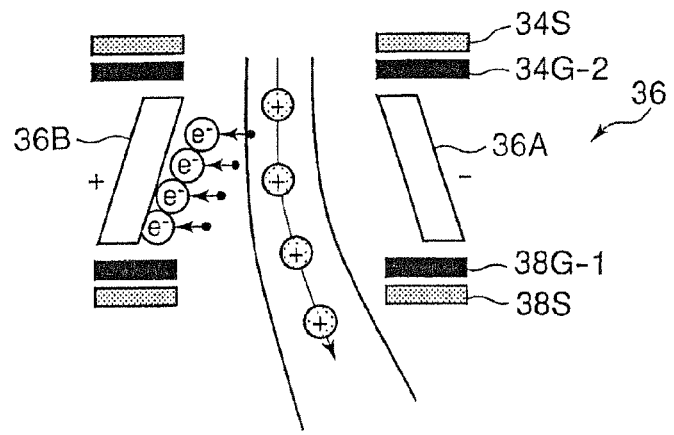

In FIG. 8A through FIG. 8C, the beam scanner 36 is shown by a cross-sectional view and illustration of the electric field correcting electrodes 36-1 and 36-2 and the shielding ground electrodes 34G-1 and 38G-2 is omitted.

Also the drawings are only schematic views for explaining the operation of the beam scanner similar to FIG. 1A through FIG. 1D explained before and sizes and positional relationships of the respective constituent elements described later by the drawings are not rectified. Further, as descried before, the shapes of the scanning electrodes 36A and 36B are constituted by the shapes in which the interval of the opposed electrode faces is increased as proceeding from the upstream side to the downstream side, and this is the aspect for enlarging the scanning angle range of the ion beam.

Figure 9:
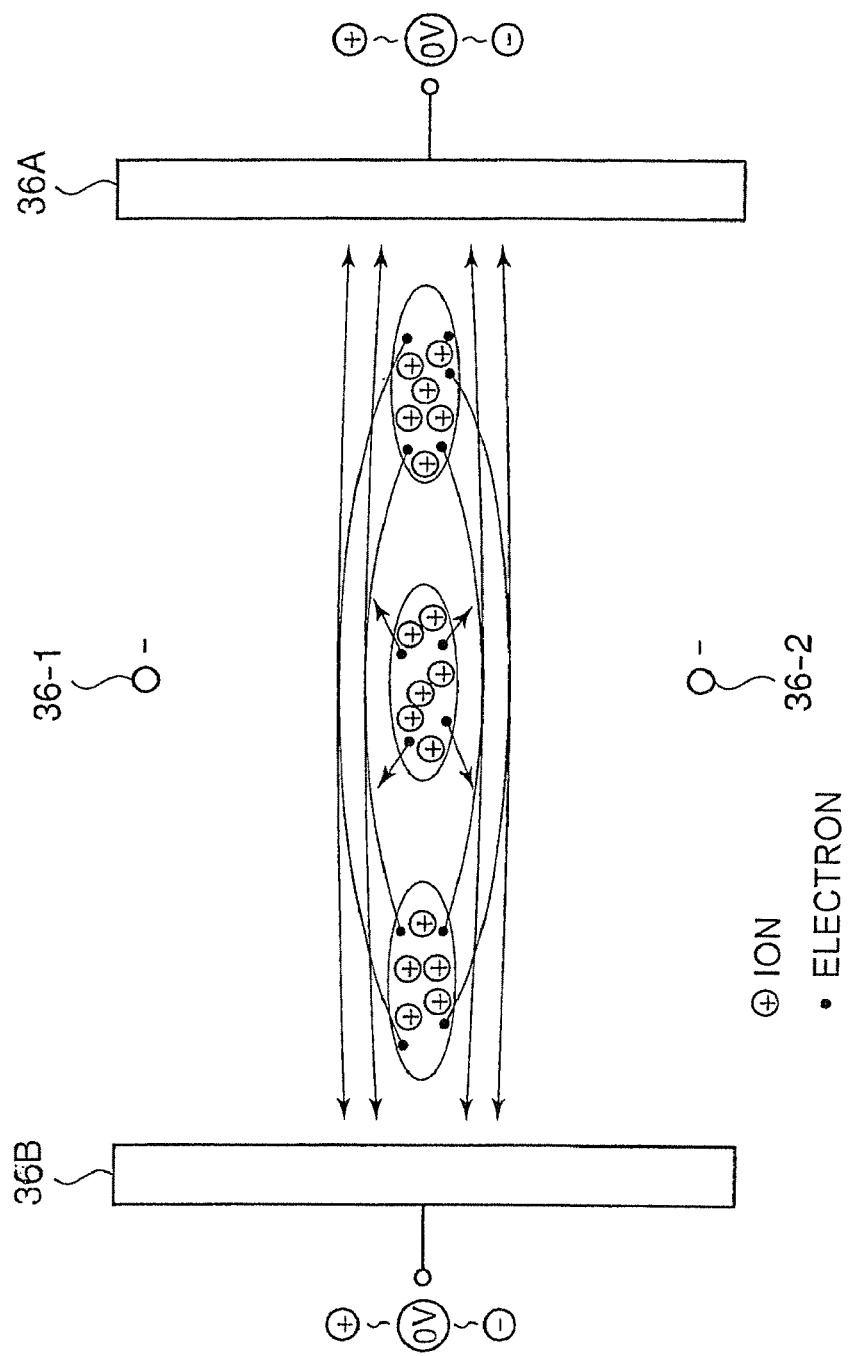
FIG. 9 is a view for explaining an operation of electric field correcting electrodes of a beam scanner according to the invention.

On the other hand, FIG. 9 is a view viewing the beam scanner from the downstream side and to make the explanation simple, the scanning electrodes 36A and 36B are shown by shapes of parallel flat plates. This signifies that the present invention is applicable to any of a constitution in which the pair of scanning electrodes are constituted by shapes of parallel flat plates as shown by FIG. 9, a constitution of enlarging the interval of electrodes in the flat plate shape as proceeding to the downstream side as shown by FIG. 8A through FIG. 8C, further, a constitution of forming the grooves extended in the beam line direction (z axis direction) at the opposed electrode faces of the pair of scanning electrodes as shown by FIG. 4 and FIG. 5A and FIG. 5B. However, the aspect of scanning electrode shown in FIG. 5A and FIG. 5B is the most preferable and reasons thereof will be described later.

In FIG. 8A, an ion having a positive charge passing the beam scanner 36 is attracted to the scanning electrode 36B on the left side having a negative voltage. On the other hand, an electron attached around the ion beam is attracted to the scanning electrode 36A on the right side having a positive voltage.

This is shown by a beam sectional shape (elliptical shape) proximate to the scanning electrode 36B in FIG. 9. Thereby, the beam passing the beam scanner 36 loses an electron, ions having positive charges are repelled by each other by a space charge effect, and therefore, the beam tends to be diverged. A mass of an electron is lighter than that of an ion, and therefore, an angle of deflection thereof is larger than that of an ion.

Also in FIG. 8C, the ion beam passing through the beam scanner 36 tends to be diverged by reason the same as that of FIG. 8A. FIG. 9 shows that an electron attached around the ion beam is attracted to the scanning electrode 36B on the left side having the positive voltage by a beam sectional shape (elliptical shape) proximate to the scanning electrode 36A.

On the other hand, FIG. 8B shows a state of the ion beam at an instance at which a voltage applied to the scanning electrodes 36A and 36B connected to an alternating current scanning power source is just 0. In FIG. 9, this is shown by a beam sectional shape (elliptical shape) positioned at a middle portion between the scanning electrodes 36A and 36B. In this case, although an electron attached around the ion beam is not attracted to the scanning electrodes 36A and 36B, the electron does not remain in the ion beam but is scattered in a random direction by being considerably operated with a negative electric field from the electric field correcting electrodes 36-1 and 36-2. Thereby, a tendency of converging the ion beam by a remaining electron is restrained.

Figure 11A:
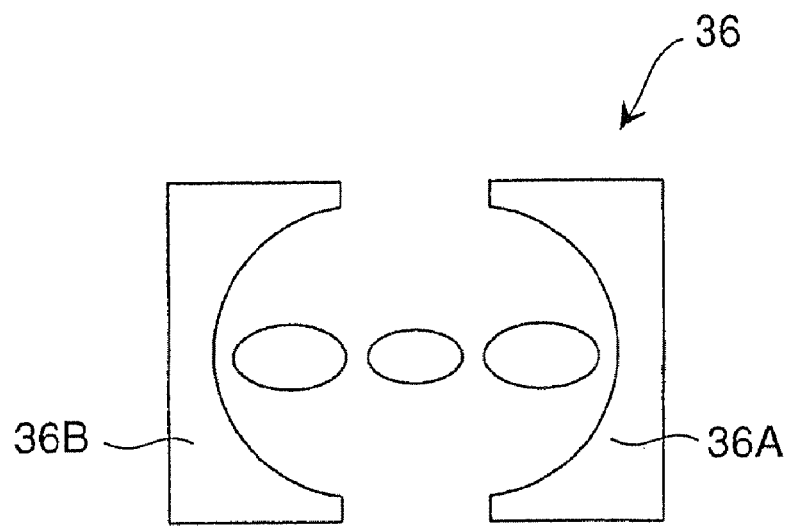
FIG. 11A and FIG. 11B are views for explaining operations of a case in which electric field correcting electrodes are not provided to the beam scanner and a case of providing the electric field correcting electrodes.
Figure 11B:
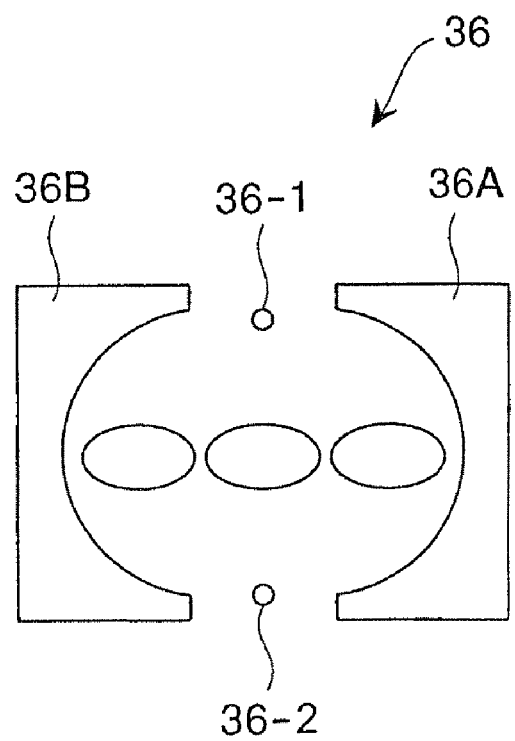

By such an operation, the electric field correcting electrodes 36-1 and 36-2 are referred to as zero electric field correcting electrodes. At any rate, by the operation of the electric field correcting electrodes 36-1 and 36-2 explained above, as shown by FIG. 11B, the sectional shape of the ion beam remain unchanged to be uniform at any of an end portion of the scanning region and a center portion of the scanning region on the downstream side of the beam scanner 36.

According to the beam scanner 36 including the electric field correcting electrodes, only when the scanning angle by the pair of scanning electrodes 36A and 36B is zero and a difference of potentials of the left and right scanning electrodes is not present, the electric field correcting electrode is made to be able to be functioned as lateral direction converging means for alleviating converging in the longitudinal direction by the second quadrupole vertical focusing electromagnet 30 (refer to FIG. 2A) by the zero electric field effect.

Further, it is preferable that the electric field correcting electrode adopts the following modes.

1. The electric field correcting electrodes are arranged on upper and lower sides by interposing a center axis of the reciprocal scanning plane between the scanning electrodes 36A and 36B.
2. The electric field correcting electrodes are arranged at inside of a space rectified by the opposed electrode faces of the scanning electrodes 36A and 36B, interposing the center axis of the reciprocal scanning plane and as proximate as possible to the ion beam reciprocally scanned.
3. Lengths of the electric field correcting electrodes are made to be substantially the same as those of the scanning electrodes 36A and 36B in the beam line direction.
4. The sectional shape of the electric field correcting electrode may be constituted by any shape of a square shape, a circular shape and the like.
5. The electric field correcting electrodes are arranged between the suppression electrode 34S and the suppression electrode 38S and connected to vicinities of center portions of the suppression electrodes 34S and 38S.
6. The electric field correcting electrodes are constituted by potentials independent from those of the suppression electrodes 34S and 38S. Further, it is preferable that the potentials in this case are made to be variable.

Next, an explanation will be made with regard to a significance of the grooves 36A-1 and 36B-1 of the scanning electrodes 36A and 36B in reference to FIG. 10A through FIG. 10C. Such a groove contributes to restrain conversion/diversion in the longitudinal direction of the ion beam to be small before and after passing the beam scanner 36.

At a location at inside of the beam scanner 36 which is not proximate to either the suppression electrode 34S of the upstream side and the suppression electrode 38S of the downstream side, the electric field produced by the scanning electrodes 36A and 36B becomes dominant.

Upper and lower components of a deflection electric field are determined by shapes of the grooves 36A-1 and 36B-1 of the scanning electrodes 36A and 36B.

Figure 10A:
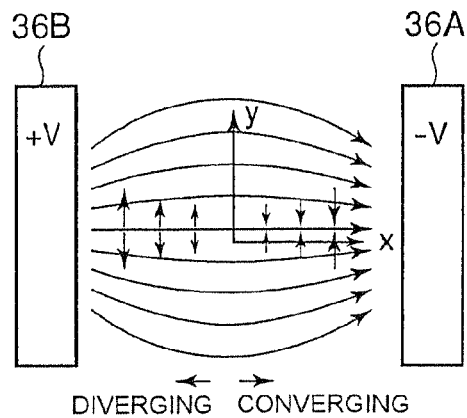
FIG. 10A through FIG. 10C are views for explaining operations of a case in which a scanning electrode of a beam scanner is not provided with a groove and a case in which the scanning electrode is provided with a groove.
Figure 10B:
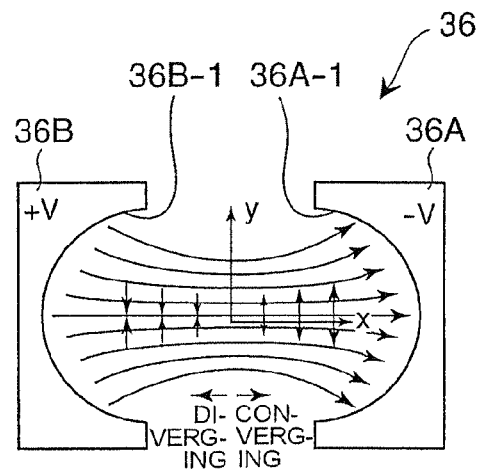
Figure 10C:
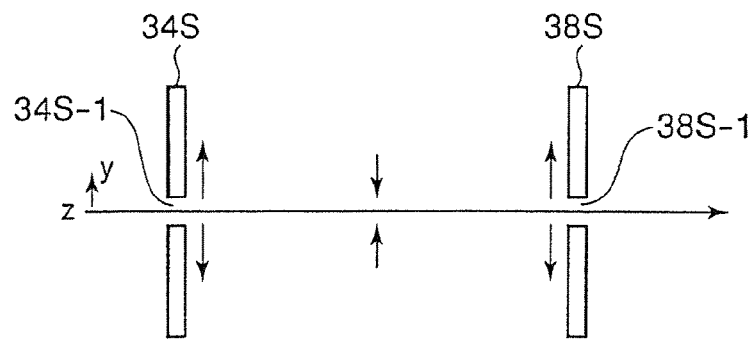

When the scanning electrode on the left side is applied with a voltage of positive +V and the scanning electrode on the right side is applied with a voltage of negative −V, a distribution of an electric field is as shown by FIG. 10A and FIG. 10B by presence or absence of the groove and a shape thereof.

According to the scanning electrodes 36A and 36B by the parallel flat plates of FIG. 10A, an electric field in a y axis direction is provided with a directionality the same as that of an electric field of the opening portion of the suppression electrode to amplify conversion/diversion of the ion beam in the y axis direction.

The scanning electrodes 36A and 36B of FIG. 10B are formed with the pertinent grooves 36A-1 and 36B-1. In this case, as shown by an arrow mark in FIG. 10C, an electric field in the y axis direction remote from the suppression electrodes 34S and 38S is provided with the directionality of canceling electric fields in the y axis direction at vicinities of the opening portions 34S-1 and 38S-1 of the suppression electrodes 34S and 38S. Although the electric field in the longitudinal (up and down) direction is very weak in comparison with the electric fields at vicinities of the opening portions 34S-1 and 38S-1 of the suppression electrodes 34S and 38S, an operating distance range is long, and therefore, the electric fields in the longitudinal direction is operated by substantially the same degree in converging and diverging in a total of the beam scanner 36.

According to the scanning electrodes 36A and 36B in FIG. 10B, conversion/diversion in the longitudinal direction of the ion beam can be restrained to be small before and after passing the beam scanner 36 by determining shapes and dimensions of the grooves 36A-1 and 36B-1 of the scanning electrodes 36A and 36B such that operations of electric fields at vicinities of opening portions of the suppression electrodes and electric fields in the longitudinal direction between the opposed electrode faces of the scanning electrodes 36A and 36B which are not proximate to the suppression electrodes are canceled by each other by substantially the same magnitudes. Further, the electric field between the opposed electrode faces of the scanning electrodes 36A and 36B can uniformly be distributed, thereby, any portion of the beam section in the elliptical shape can be deflected by the same angle of deflection.

Referring back to FIG. 6, the scanning electrodes 36A and 36B and the shielding suppression electrode assemblies are contained at inside of the scanner housing 37 constituting a vacuum vessel and arranged on the beam line. In this way, an influence of the scanning electrodes 36A and 36B on an outside of an electric field can be shut out by arranging the scanning electrodes 36A and 36B and shielding suppression electrode assemblies in a space at inside of the scanner housing 37 independent from other constituent elements to be isolated from the other constituent elements. Further, by constituting a maximum width of a beam inlet portion 37-1 of the scanner housing 37 substantially to be the same as the maximum width W36 in (FIG. 5B) of the beam inlet portion of the scanning electrodes 36A and 36B, the ion beam having a large beam diameter in the lateral direction is made to be further incident on the scanner housing 37.

Further, the parallel lens housing 41 containing the parallel lens 40 is connected to a beam outlet portion 37-2 of the scanner housing 37, and a maximum width (lateral width) of the beam outlet portion 37-2 of the scanner housing 37 is constituted to be substantially the same as a maximum width (lateral width) of the beam inlet portion of the parallel lens 40. Thereby, in comparison with the related art in which the lateral width of the inlet portion of the parallel lens is slightly narrower than the lateral width of the beam outlet portion of the scanner housing, the ion beam at an end portion of the scanning region is made to be able to be incident on the inlet portion of the parallel lens 40 without being cut.

Further, by connecting the parallel lens housing 41 containing the parallel lens 40 to the beam outlet portion 37-2 of the scanner housing 37 and constituting the parallel lens 40 by a deceleration ratio of 1:3 or less, a quasi radius of curvature of the noncircular curved parallel lens 40 is constituted to be large, and there is used a parallel lens having a small deceleration ratio enlarging the quasi radius of curvature of the noncircular curve lens by lowering a deceleration effect and a beam converging effect of the ion beam. Thereby, the more proximate to the both side end portions of the parallel lens 40, the considerably shallower the angle of incidence of the ion beam to the parallel lens 40 can be made, a deceleration effect can be promoted, and diversion of the ion beam can be restrained as much as possible by significantly deflecting the ion beam to the beam trajectory line in parallel with an original beam trajectory line before deflection.

(Operation)

As described above, according to the ion implantation apparatus 1 of the present invention, the ion beam passing through the mass analysis magnet apparatus 22 is converged in the longitudinal direction by the first quadrupole vertical focusing electromagnet 24. Thereafter, only an ion beam comprising an ion of a predetermined mass passing through the park electrode 26 is made to pass through the mass analysis slit 28. The ion beam passing through the mass analysis slit 28 is shaped by being adjusted by receiving a converging operation in the longitudinal direction further by the second quadrupole vertical focusing electromagnet 30.

An explanation will be given of converging and shaping of the ion beam from the ion source 10 to the accelerating/decelerating column 42 in reference to FIGS. 2A and 2B and FIGS. 3A and 3B. FIGS. 2A and 3A are views viewing major constituent elements of the ion implantation apparatus and an ion beam passing therethrough from an upper side, FIGS. 2B and 3B are views viewing an arrangement relationship of FIGS. 2A and 3A from a side direction. Further, in order to facilitate understanding, the respective constituent elements are shown by being spaced apart from each other by sufficient intervals thereamong.

The ion beam extracted from the ion source 10 by the extracting electrode 12 enters into the mass analysis magnet apparatus 22. The ion beam is emitted as an ion beam converged in the longitudinal (vertical) direction and diverged in the horizontal (lateral) direction by an operation of electric field of an extracting slit provided at the extracting electrode 12. At the mass analysis magnet apparatus 22, the mass analysis is carried out for the incident ion beam and only a necessary ion species is selected. By the vertical converging lens operation of the extracting electrode 12 and a convex lens operation in the lateral direction of the mass analysis magnet apparatus 22, a beam width (diameter in the longitudinal direction) of the ion beam incident on the mass analysis magnet apparatus 22 in the longitudinal direction is minimized at a center position of the mass analysis magnet apparatus 22 and a beam width (diameter in the lateral direction) in the lateral direction is maximized. The ion beam passing through the center position of the mass analysis magnet apparatus 22 is diverged in the beam width in the longitudinal direction and converged in the beam width in the lateral direction.

As described above, the first quadrupole vertical focusing electromagnet 24 serves to converge the beam width of the ion beam passed through the mass analysis magnet apparatus 22 in the longitudinal direction and diverges in the lateral direction. That is, the ion beam having a vertically prolonged sectional shape having the large beam width in the longitudinal direction (diverged in longitudinal direction) and small beam width in the lateral direction (converged in lateral direction) enters into the first quadrupole vertical focusing electromagnet 24. The first quadrupole vertical focusing electromagnet 24 serves to converge the beam width of the ion beam in the longitudinal direction and diverge the beam width in the lateral direction. As a result, the ion beam diverging the beam width in the longitudinal direction and converging the beam width in the lateral direction is maximized in the beam width in the longitudinal direction and minimized in the beam width in the lateral direction at the position of the mass analysis slit 28. When the first quadrupole vertical focusing electromagnet 24 is arranged on an upstream side of the mass analysis slit 28, most of the ion beam having a wide vertical width is made to be able to pass through the mass analysis slit 28. Further, also diversion in the longitudinal direction can be restrained and most of the ion beam is made to pass therethrough in the longitudinal direction. That is, an unnecessary cut or an unnecessary diversion can be prevented.

The ion beam passed through the mass analysis slit 28 is converged in the longitudinal beam width in the vertical direction since the right and left beam width in the lateral direction which has been converged is changed to be diverged.

The second quadrupole vertical focusing electromagnet 30 serves to converge the beam width of the ion beam passed through the mass analysis slit 28 in the longitudinal direction and diverge the beam width in the lateral direction. That is, the ion beam having the vertically prolonged sectional shape having a large beam width in the longitudinal direction (diverged in longitudinal direction) and the small beam width in the lateral direction (converged in lateral direction) is made to be entered into the second quadrupole vertical focusing electromagnet 30. The second quadrupole vertical focusing electromagnet 30 serves to converge the beam width of the ion beam in the longitudinal direction and diverge the beam width in the lateral direction.

Thereby, the ion beam converged strongly in the longitudinal direction and diverged in the lateral direction, that is, the ion beam sectional shape of which is constituted by an elliptical shape or a flat shape prolonged in the lateral direction is transmitted to the beam scanner 36 contained in the scanner housing 37. Thereby, the ion beam is minimized in the beam width in the longitudinal direction and maximized in the beam width in the lateral direction at a vicinity of an inlet of the beam scanner 36 having a pair of scanning electrodes 36A and 36B (vicinity of suppression electrode 34S of FIG. 2A). From such a view point, it is preferable that a portion of installing the second quadrupole vertical focusing electromagnet 30 is arranged on a beam line of a section of the beam line from the outlet of the mass analysis slit 28 to before incidence on the beam scanner 36 and at a position in a middle state of converging and diverging the ion beam. This is because a sectional size (size in longitudinal direction) of the ion beam is preferably large in order to effect a large converging force to the ion beam in the longitudinal direction.

The ion beam advancing on the beam trajectory line by being incident on the stable beam scanner 36 stabilized by carrying out shielding and suppression of the electron by the shielding suppression electrode assemblies arranged on front and rear sides of the beam scanner 36 is reciprocally scanned (scanning) in a certain scanning range in the left and right (lateral or horizontal) direction by the electric field generated by alternately interchanging to apply positive and negative voltages to the beam scanner 36. At this occasion, in alternately interchanging to apply positive and negative voltages, an instance at which voltages applied to the two left and right electrodes of the scanning electrodes 36A and 36B become zero is generated always at each time of alternately interchanging the voltages, however, an abrupt change in the shape of the ion beam is restrained by the electric field correcting electrodes 36-1 and 36-2 of zero electric field installed between the two left and right scanning electrodes 36A and 36B. Further, the reciprocally scanned ion beam is incident on the parallel lens 40 while being diverged in the vertical direction, paralleled in the direction the same as the original beam trajectory line before deflection (parallel formation), and advances while being converged by receiving the converging operation vertically and horizontally. Further, the ion beam arriving at the wafer 58 by advancing while being converged is subjected to ion implantation to the wafer 58.

Although an explanation has been given of the ion implantation apparatus according to the present invention with regard to preferable embodiments, the ion implantation apparatus according to the invention may be realized by being modified as follows.

Although according to the embodiment, there is constructed a constitution of reciprocally scanning periodically the ion beam in the horizontal direction orthogonal to the beam line direction, instead thereof, there may be constructed a constitution of periodically scanning reciprocally the ion beam in a specific direction other than the horizontal direction, for example, in a vertical direction.

Further, as shown by FIG. 3A and FIG. 3B, the position of the ion beam may be adjusted in the lateral direction by arranging a steering coil Cx for adjusting in the lateral direction between the mass analysis slit 28 and the second quadrupole vertical focusing electromagnet 30, preferably, at a position on an upstream side proximate to the ion beam inlet of the second quadrupole vertical focusing electromagnet 30 although illustration thereof is omitted in FIG. 2A and FIG. 2B.

Although the embodiment is a case of applying the present invention to the ion implantation apparatus of the single wafer type, the present invention may be applied to an ion implantation apparatus of a batch type.

What is claimed is:

1. A beam processing apparatus including a beam scanner having a two electrodes type deflection scanning electrode by opposed electrodes of a bilaterally-symmetric shape opposed to each other and having grooves extended in a beam line direction at opposed electrode faces thereof for carrying out deflection scanning of a periodically changing trajectory of a charged particle beam;
    wherein the beam scanner further includes shielding suppression electrode assemblies respectively at vicinities of upstream side and downstream side of the two electrodes type deflection scanning electrode and having openings in a rectangular shape for passing the charged particle beam;
    wherein each of the shielding suppression electrode assemblies is an assembly electrode comprising one sheet of a suppression electrode and two sheets of shielding ground electrodes interposing the suppression electrode;
    wherein a total of front side portions and rear side portions of the two electrodes type deflection scanning electrode is shielded by the two sheets of shielding ground electrodes;
    wherein a pair of electric field correcting electrodes extending in a direction orthogonal to an opposing direction of the two electrodes type deflection scanning electrode are arranged at a zone of the two electrodes type deflection scanning electrode and along the beam line direction to be opposed to each other by interposing a center axis of a place of reciprocally scanning the charged particle beam;
    wherein the pair of electric field correcting electrodes are the same as potentials of the upstream side suppression electrode and the downstream side suppression electrode, and
    wherein the pair of electric field correcting electrodes are arranged between the upstream side suppression electrode and the downstream side suppression electrode by penetrating the upstream side shielding ground electrode and the downstream side shielding round electrode which are close to the two electrodes type deflection scanning electrode, and the pair of electric field correcting electrodes are supported and connected conductively or insulatedly to vicinities of center portions of the upstream side suppression electrode and the downstream side suppression electrode.

2. The beam processing apparatus according to claim 1, wherein the beam processing apparatus is constituted such that the two electrodes type deflection scanning electrode includes a beam inlet portion and a beam outlet portion, a maximum width of the beam inlet portion is made to be smaller than a maximum width of the beam outlet portion, and a length in the beam line direction is shorter than the maximum width of the beam inlet portion.

3. The beam processing apparatus according to claim 1, wherein heights in a longitudinal direction of the two electrodes type deflection scanning electrode and the shielding suppression electrode assemblies are constituted to be the same.

4. The beam processing apparatus according to claim 1, wherein a sectional shape of the groove of the opposed electrode is constituted by a flat face with regard to a region in correspondence with a scanning plane of the charged particle beam, and constituted by an inclined face in which an interval of the opposed electrode faces is narrowed as being remote from the flat face region with regard to an upper side and a lower side of the flat face region.

5. The beam processing apparatus according to claim 1, wherein the suppression electrode is applied with a constant or a variable direct current voltage independently, and the two sheets of shielding ground electrodes are grounded to a ground potential.

6. The beam processing apparatus according to claim 1, wherein a thickness of the electrode in the beam line direction of the suppression electrode is constituted to be thicker than a thickness of the shielding ground electrode.

7. The beam processing apparatus according to claim 1, wherein a width of the opening for passing the beam of the shielding suppression electrode assembly on the upstream side of the two electrodes type deflection scanning electrode is substantially made to be the same as a maximum width of the beam inlet portion of the two electrodes type deflection scanning electrode.

8. The beam processing apparatus according to claim 1, wherein a width of the opening for passing the beam of the shielding suppression electrode assembly on the downstream side of the two electrodes type deflection scanning electrode is substantially made to be the same as a maximum width of the beam outlet portion of the two electrodes type deflection scanning electrode.

9. The beam processing apparatus according to claim 1, wherein shielding members are respectively arranged on upper and lower sides and left and right sides of the two electrodes type deflection scanning electrode to be grounded to a ground potential, and the two electrodes type deflection scanning electrode is shielded from six directions of front and rear directions, upper and lower directions and left and right directions along with the shielding ground electrode.

10. The beam processing apparatus according to claim 1, wherein the pair of electric field correcting electrodes apply potentials the same as potentials of the upstream side suppression electrode and of the downstream side suppression electrode, or variable potentials respectively independent from each other.

11. The beam processing apparatus according to claim 1, wherein the two electrodes type deflection scanning electrode and the shielding suppression electrode assemblies are arranged on the beam line by being contained in a scanner housing constituting a vacuum vessel.

12. The beam processing apparatus according to claim 11, wherein a maximum width of a beam inlet portion of the scanner housing is constituted to be substantially the same as the maximum width of the beam inlet portion of the two electrodes type deflection scanning electrode.

13. The beam processing apparatus according to claim 11, wherein a beam outlet portion of the scanner housing is connected with a parallel lens housing containing a parallel lens and a maximum width of the beam outlet portion of the scanner housing is constituted to be substantially the same as a maximum width of the beam inlet portion of the parallel lens.

14. The beam processing apparatus according to claim 11, wherein a beam outlet portion of the scanner housing is connected with a parallel lens housing containing a parallel lens, the parallel lens is constituted to be equal to or smaller than a deceleration ratio of 1:3, and a quasi radius of curvature of a noncircular curve of the parallel lens is constituted to be large.

* * * * *

UNITED STATES PATENT AND TRADEMARK OFFICE
CERTIFICATE OF CORRECTION

PATENT NO. : 7,982,192 B2  
APPLICATION NO. : 12/106735  
DATED : July 19, 2011  
INVENTOR(S) : Mitsukuni Tsukihara et al.

Page 1 of 1

It is certified that error appears in the above-identified patent and that said Letters Patent is hereby corrected as shown below:

Title Page:

In (73)  Assignee, please correct the Assignee's Information to read as follows:

(73)  SEN Corporation, an SHI and Axcelis Company, Tokyo (JP)

Signed and Sealed this  
Thirtieth Day of August, 2011

David J. Kappos  
*Director of the United States Patent and Trademark Office*